United States Patent [19]

Halter

[11] 4,283,678
[45] Aug. 11, 1981

[54] CABLE CONDITION ANALYZING SYSTEM FOR ELECTRIC ARC FURNACE CONDUCTORS

[75] Inventor: Matthew R. Halter, Bay Village, Ohio

[73] Assignee: Watteredge-Uniflex, Inc., Avon Lake, Ohio

[21] Appl. No.: 912,342

[22] Filed: Jun. 5, 1978

[51] Int. Cl.³ .................... G01R 19/02; G01R 31/02
[52] U.S. Cl. ................................ 324/140 R; 324/51; 324/127; 328/116
[58] Field of Search ................. 324/51, 77 R, 77 A, 324/102, 103 R, 112, 120, 127, 140, 142, 73 R, 111, 114; 340/150, 664; 328/104, 116, 117, 151; 307/353, 355; 361/110

[56] References Cited

U.S. PATENT DOCUMENTS

| | | | |
|---|---|---|---|
| 2,937,369 | 5/1960 | Newbold et al. | 324/111 X |
| 3,185,925 | 5/1965 | Grass | 324/102 X |
| 3,201,688 | 8/1965 | Ferguson | 324/103 R |
| 3,201,781 | 8/1965 | Holland | 324/120 UX |
| 3,243,705 | 3/1966 | Chenoweth | 328/104 X |
| 3,256,492 | 6/1966 | Gilchrist | 324/73 UX |
| 3,289,079 | 11/1966 | Ferguson | 324/103 R |
| 3,445,768 | 5/1969 | Ferguson | 324/142 |
| 3,488,588 | 1/1970 | Deavenport et al. | 324/120 X |
| 3,548,305 | 12/1970 | Kaufman | 324/77 R |
| 3,602,826 | 8/1971 | List | 307/353 X |
| 3,753,104 | 8/1973 | Shaw | 324/114 |
| 3,769,440 | 10/1973 | Goodman | 13/12 |
| 3,836,851 | 9/1974 | Schumann | 324/102 |
| 3,880,147 | 4/1975 | Gruenke et al. | 324/77 R X |
| 4,006,413 | 2/1977 | Silberberg | 324/102 |
| 4,056,839 | 11/1977 | Andow | 361/110 |
| 4,160,922 | 7/1979 | Rickenbacker | 324/111 X |

FOREIGN PATENT DOCUMENTS 979055 1/1965 United Kingdom.
1144282 3/1969 United Kingdom.
1399187 6/1975 United Kingdom.

OTHER PUBLICATIONS

Schwabe et al., "Report on Ultrahigh Power Operation of Electric Steel Furnaces," *Electric Furnace Proceedings,* 1966, pp. 125, 130, 131.

Primary Examiner—Gerard R. Strecker
Attorney, Agent, or Firm—Maky, Renner, Otto & Boisselle

[57] ABSTRACT

The present invention provides for measuring and analyzing AC currents and preferably relatively large AC currents, such as those that are conventionally delivered to an electric arc furnace, as an indication of the current carrying capability or condition of one or, preferably, several cables, e.g. electric arc furnace conductors, carrying such AC currents. The invention monitors such AC currents for a period of time, stores the monitored information, and permits subsequent readout of the stored information.

28 Claims, 6 Drawing Figures

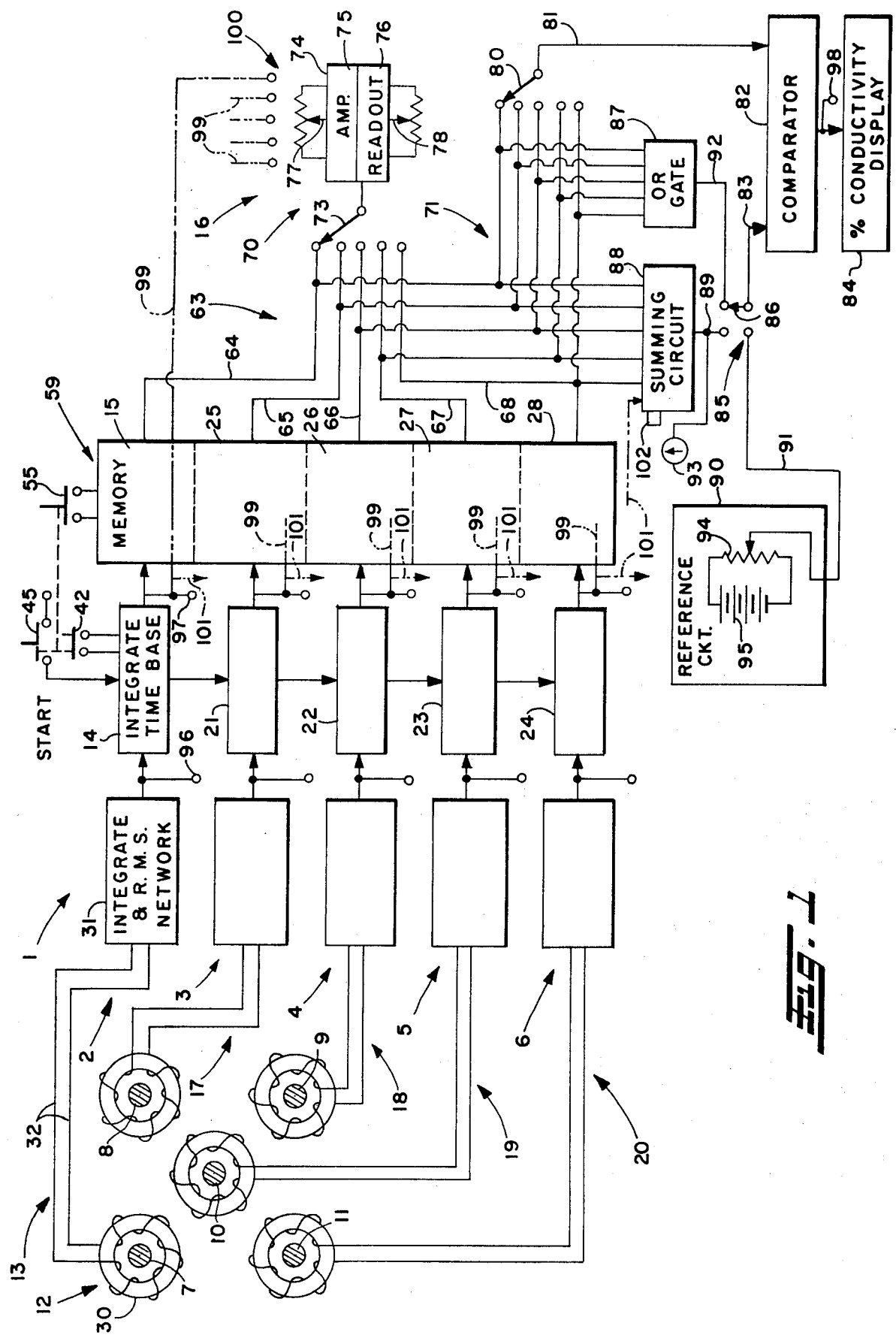

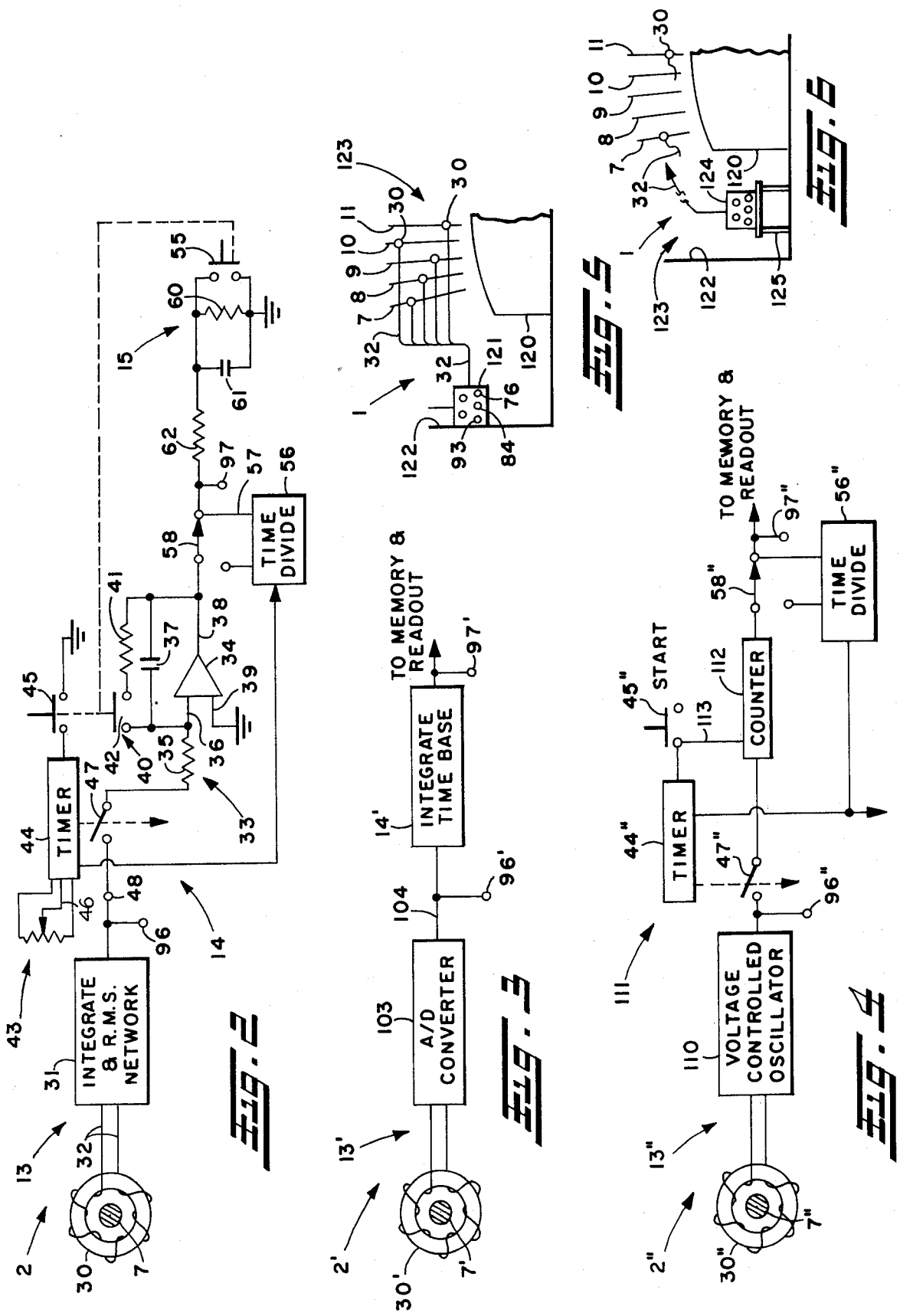

CABLE CONDITION ANALYZING SYSTEM FOR ELECTRIC ARC FURNACE CONDUCTORS

TECHNICAL FIELD

The present invention relates generally to a system for monitoring and/or analyzing the condition of electrical conductors or cables and, more particularly, to such a system for analyzing the condition of electric arc furnace conductors.

BACKGROUND OF PRIOR ART

In electric arc furnaces, such as those used in the manufacturing of steel, multiple phase alternating current electrical power is generally used to create thermal energy. In one example, three phase alternating current power is supplied to the furnace, with each electrode thereof receiving a respective one of the three phases. The alternating current electrical power of each respective phase is generally delivered from the power source to an electrode via a group, i.e. a plurality, of multiple conductor electrical cables, each of which may be a flexible water-cooled cable. In the event that one of the cables of a given group supplying the alternating current electrical power of a given phase were to deteriorate, for example with age or due to overheating, such that it carries less than its intended amount of current, one or more of the other cables in the group then may be required to carry excessive current that would damage the same. It is, accordingly, desirable to determine when a cable of such a group of cables, for example, has deteriorated to the point of near complete failure or has reached a point where it is causing overloading of the other cables in the group carrying the given phase of current, thereby causing increased deterioration of such other cables.

At present a principal reliable and practical procedure to check the condition of such cables includes the shut-down of the furnace, removal of each cable from the furnace, and the measuring of the resistance of each cable with a low range ohmmeter. This technique, however, is extremely time consuming and, additionally, requires the shut-down and subsequent restart of the furnace, thus reducing the operational efficiency of the latter.

According to another technique a separate current transformer is positioned about each of the cables of a group carrying a given phase of electrical power to the furnace. A separate voltmeter is attached to each such current transformer to indicate output information representative of the electrical current carried by the respective cables. This technique, however, also suffers from a number of disadvantages, including, for example, fluctuations in the output information with respect to frequently occurring fluctuations in the currents carried by the respective cables, the need for separate meters, the short, nearly instantaneous, life of the output information displayed by the meters, and so on. Often it is difficult or impossible to take such instantaneous readings using conventional metering equipment primarily because of the very large and frequently occurring fluctuations in current flow to an electric furnace.

BRIEF SUMMARY OF INVENTION

The present invention provides for measuring and analyzing AC currents and preferably relatively large AC currents, such as those that are conventionally delivered to an electric arc furnace, as an indication of the current carrying capability or condition of one or, preferably, plural cables, e.g. electric arc furnace conductors, carrying such AC currents. It will be appreciated that the invention may be utilized for monitoring and analyzing the condition of other types of electrical cables. However, to facilitate the description below, the invention will be described in connection with plural, for example five, cables forming a group of cables that supply one phase of a three phase power conveying system between a three phase electric power supply and an electric arc furnace. The terms cables and conductors will be used, in most instances, equivalently herein.

The invention monitors such AC currents for a period of time, stores the monitored information, and permits subsequent read-out of the stored information.

According to the present invention a separate current transformer, such as a toroid, is placed about each cable of the group, and a separate integrating and R.M.S. network or circuit associated with each transformer converts the signal produced thereby to an R.M.S. value representative of the effective heating power of the currents being carried instantaneously in the respective cables. Each R.M.S. signal is used as an input to a respective timed integration network to integrate such R.M.S. signal for a selected period of time in order to eliminate the effect of fluctuations in the AC current in the cables, thereby to provide an integrated signal output representing the average value of current carried by each cable. A memory stores each of the integrated signals, and a single measuring and output display device, such as a current meter display, can be operated selectively to read out each of those stored values usually after the measurement period.

In accordance with another aspect of the invention, an analog to digital converter is used to convert the analog-like signal from the respective current transformers to digital information that is provided as the input to the timed integration network. Such analog to digital converter, preferably one for each cable, provides a measure of isolation between the respective current transformers and timed integration networks and to an extent provides an averaging of the signals delivered thereto while eliminating effects of the mentioned fluctuations.

A further aspect of the invention includes the use of a voltage controlled oscillator, which produces an output signal that varies in frequency as the sensor voltage fluctuates, and a counter, which counts peaks of such output signal for a selected interval, the count then representing the monitored cable current for storage and selected display.

According to a further aspect of the invention, the percent conductivity of each monitored cable is determined as a function, for example, of the monitored conductor carrying the largest current, the current carrying capability of all of the monitored cables, or a reference signal representative of the current carrying capability of a known cable.

With the foregoing in mind, a principal object of the invention is to determine the condition of an electrical cable without removing the cable from its operative connection, for example, relative to an electric arc furnace.

Another object is to provide a relatively long duration meaningful display of information concerning the condition of an operative electrical cable.

An additional object is to monitor the condition of plural current carrying conductors or cables and to provide output information concerning such condition.

A further object is to monitor substantially simultaneously, and preferably over a period of time to avoid inaccuracies due to brief fluctuations, the condition of one or more current carrying conductors or cables, to store the information so obtained, and selectively to read out the information at will.

Still another object is to accomplish the foregoing and other advantages of the invention in connection with electric arc furnace conductors or cables, in particular where electric current of each electrical phase supplied such furnace is carried by plural conductors. Moreover, still an additional object is to obtain output information as a relationship of a given one of such plural conductors to another such conductor, say the one carrying the largest current, to all of the conductors, or to an externally derived reference level indicative of, for example, the expected current carrying capability of a known cable.

These and other objects and advantages of the present invention will become apparent as the following description proceeds.

To the accomplishment of the foregoing and related ends, the invention, then, comprises the features hereinafter fully described in the specification and particularly pointed out in the claims, the following description and the annexed drawings setting forth in detail certain illustrative embodiments of the invention, these being indicative, however, of but several of the various ways in which the principles of the invention may be employed.

BRIEF DESCRIPTION OF DRAWINGS

In the annexed drawings:

FIG. 1 is a schematic electric circuit diagram, partly in block form, illustrating the cable condition analyzing system of the present invention as employed to monitor plural cables;

FIG. 2 is a schematic electric circuit diagram of one of the monitor channels of the system of FIG. 1;

FIGS. 3 and 4 are partial schematic electric circuit diagrams of alternate monitor channels that may be employed in the system of FIG. 1; and FIGS. 5 and 6 are schematic illustrations showing the system of the invention permanently and portably, respectively, positioned relative to a furnace.

DETAILED DESCRIPTION OF INVENTION

Referring in detail to FIGS. 1 and 2 of the drawing, a cable condition analyzing system in accordance with the present invention is generally indicated at 1. The system 1 has a plurality of monitor channels 2–6 associated with respective cables 7–11, for example, each of which may be a multiple conductor electrical cable through which AC electrical signals may pass. In accordance with the best mode of the invention, the plural cables 7–11 form a group 12 of cables that supplies one phase of AC electrical power from a conventional current supply transformer (not shown) to a multiple phase, say a three phase, electrical furnace (not shown). Each of the cables 7–11 may be, for example, an individual water cooled conductor cable. It is the purpose of the best mode of the invention, i.e. the system 1, to monitor the currents flowing through the cables 7–11 during operation thereof and to provide meaningful output information that is conveniently useful to indicate the individual or relative condition or current carrying capability of the cables 7–11 while the latter are in operation. For example, as a given cable ages or deteriorates, its impedance increases and the amount of current it is capable of carrying generally will decrease, especially in relation to parallel such cables; by monitoring the individual currents cable condition can be determined. It will be appreciated, of course, that the system 1 may be enlarged to monitor and/or to analyze the condition of more or fewer than five cables of the same and, if desired, different phases. Alternatively, separate systems 1 may be used to monitor and/or to analyze the plural cables of each respective group of cables supplying all of the phases to a multiple phase electric arc furnace. Further, it will be understood that the system 1 in accordance with the present invention may be employed to monitor and/or to analyze the condition, for example the current carrying capability, of other types of electrical conductors.

Briefly, each of the monitor channels 2–6 develops an electrical signal over a selected period of time, whereby such electrical signal represents the AC electrical current flowing through the respective cable for that time. As such signal is being developed or after it has been stored, output circuitry may be selectively operated, for example at the will of a technician, to display or to read out the stored signal, as output information indicative of the condition or current carrying capability of the respective cable, either as an absolute value or as a relative one. Such a relative value may be considered a percent conductivity, with the stored signal derived from a given cable being compared to the largest stored signal, to the sum of all the signals, or to a reference signal, the latter being representative of the anticipated current carrying capability of a known cable, such as a new cable.

The monitor channel 2 includes an input circuit 13 that produces an electrical signal indicative of the current substantially instantaneously being carried by the cable 7; a timed integration network 14, which integrates the input signal for a period of time that can be selected, as desired, substantially eliminating the effect of fluctuations in the cable current and providing a true time average integrated signal representation of the current carried by the cable 7; and a memory 15, which stores the integrated signal value for subsequent read-out by the read-out circuitry 16. The monitor channels 3–6 are substantially the same as the monitor channel 2, including, respectively, input circuits 17–20, timed integration networks 21–24, and memories 25–28. For brevity only the monitor channel 2 will be described in detail below, it being appreciated that such description also applies to the monitor channels 3–6.

In the monitor channel 2 the input circuit 13 includes a transducer 30 and an integrate and R.M.S. (root-mean-square) network 31 both of which, for example, may be as those disclosed in U.S. Pat. Nos. 3,201,688 and 3,289,079, which are hereby incorporated by reference. The transducer 30 may be a toroid coil that encircles the cable 7; however, it will be appreciated that other conventional transducers may be employed to produce a transducer signal, in the preferred embodiment a voltage, representative of the current in the cable. Preferably the toroid coil is of the copper clad split type of construction that opens up and may be clamped on the cable to facilitate its placement therearound without disconnecting the cable from service. The voltage induced in the toroid coil transducer 30 will be proportional to the rate of change or differential of the current in the conductor 7, and a pair of conductors 32 delivers such voltage to the network 31. The network 31 provides several functions, including converting the transducer voltage to a signal that is accurately reflective of the effective heating value of the current flowing in the conductor 6. The network 31 also provides some isolation between the transducer 30 and the timed integration network. Clearly if an alternative form of transducer were used, it may be necessary to modify the network 31. For example, if the transducer signal were directly proportional, as opposed to being a differential, to the cable current, then at least the integrating portion of the network 31 may be eliminated.

The timed integration network 14 is in effect a timed device for combining portions of the signal from the network 31 for a timed duration and includes, for example, as shown in FIG. 2, an integrator 33 formed by an operational amplifier 34 having a resistor 35 connected to one input 36, a capacitor 37 providing feed-back from the output 38, and another input 39 coupled, for example, to a source of reference potential such as a relative ground potential. Such integrator 33 is a conventional one, its operation being well known. An initializing circuit 40 for the integrator 33 including a relatively small resistor 41 and a selectively operated switch 42, is provided to discharge the capacitor 37 prior to an integration cycle performed by the integrator. It will be appreciated that other types of integrators and initializing circuits may be employed within the scope of the present invention.

The timed integration network also has a timing circuit 43 for selectively controlling the period of time over which the integrator 33 performs its integrating function. The timing circuit 43 includes a conventional timer 44, such as an electronic timer, and a start switch 45, which may be selectively operated to start the timer 44 in a given timing cycle. For example, to start such a cycle, closure of the start switch 45 may provide a source of reference potential, such as ground potential, or a higher or lower level signal to the timer 44, whereupon circuitry in the latter, in conventional manner, is initialized, and upon opening such start switch the timer promptly commences timing the cycle of operation. The duration of such timed cycle may be selectively adjusted by a technician utilizing the system 1 by adjustment of a potentiometer tap or the like 46. The timer 44 operates a switch 47, which may be a mechanical or solenoid operated switch, an electronic switch, such as an SCR or the like, or other types of switches, that is closed during the timed cycle to establish a connection for the selected period of time between the R.M.S. network 31 of the input circuit 13 and the resistor 35 input to the integrator 33. While the switch 47 is closed, the integrator 33 will integrate the input signal provided at the output 48 of the R.M.S. network, and at the conclusion of the timed cycle, the voltage level at the output 38 of the integrator 33 will be the integrated signal value representative of the current carried by the conductor 7 during the timed cycle. That integrated signal value, then, is stored in the memory 15.

The single timer 44 also is coupled to the switches in the timed integration networks 21-24, respectively, similar to the switch 47. The timer 44 closes and opens all of such switches, e.g. 47, simultaneously so that in the preferred embodiment all of the monitor channels 2-6 operate simultaneously for the same period of time to produce and to store respective integrated signal values in their respective memories 15, 25-28, whereby each of the stored signals is indicative of the current carried by the respective cables 7-11 over the same period of time and, therefore, can provide accurate relative information concerning the condition of the cables. Preferably the start switch 45 is ganged with the initializing switch 42 and with another initializing switch 55 associated with the memory or memories to initialize the same in conventional manner, say to a zero value, just prior to the start of a timed cycle.

In accordance with the preferred embodiment or best mode of the invention, the timed integration network 14 is a time base integrator. Accordingly, a conventional divider circuit 56 divides the integrated signal value produced at the output 38 of the integrator 33 by a signal representing the length of the timed cycle determined by the timer 44 so that the time base integrated signal produced at the output 57 of the divider circuit 56 in effect represents the true average effective heating value of the current carried by the conductor 7. A switch 58 may be selectively operated by a technician either to provide the full integrated signal value from the integrator 33 or the time average value to the memory 15. An advantage obtained using the time average signal and divider circuit 56 forming the same is the standardization or normalization of the information obtained by the system 1 for one group 12 of cables relative to the information obtained by a similar system coupled to another group of cables and wherein the timed cycle of operations of such systems differ. As another alternative, it will be appreciated that suitable conventional calibration techniques may be followed to relate the information obtained by one system 1 during respective timed cycles of operation and/or another such system 1.

There is, of course, an abundance of electrical and electronic memories available. Illustrated in FIG. 1 is a representative combined memory 59, which may have separate portions indicated at 15 and 25-28, or such portions may be discrete individual ones, as illustrated, for example, in FIG. 2. The discrete memory 15 of FIG. 2, for example, includes a conventional resistor 60 and capacitor 61 storage circuit coupled by an input resistor 62 to receive the full integrated signal value or average integrated signal value from the output of the timed integration network 14. It is the purpose of the memory 15 to store the signal received from the integration network 14 for a relatively long period of time so that it can be selectively read out, for example, at will by a technician; thus, the time constant of the RC storage circuit is relatively large. Other types of memories, for example digital type memories, such as a RAM (random access memory) with associated analog to digital and/or digital to analog conversion circuitry also may be employed in accordance with the invention. Regardless of the memory type, however, it is desired that the memory be relatively nonvolatile unless deliberately changed, for example in response to operation of the integration network 14, initializing by the switch 55, etc. An exemplary digital memory is sold by Rogers Corporation, Chandler, Arizona, under the trademark "Mini/Bus".

The read-out circuitry 16 receives the stored signals from the respective memories 15, 21-24 via a multiple conductor bus 63, in the illustrated embodiment containing five lines 64-68, and the read-out circuitry may be selectively operated to read out the stored signals in an absolute value format by read-out portion 70 and/or in a relative value format by read-out portion 71. To obtain the absolute value format output, a selector switch 72, which includes a movable switch arm 73, is selectively connectable to respective lines of the bus 63 to provide a respective stored signal to an absolute value display 74. The absolute value display may include various types of indicating meters, recorders or the like. However, in the preferred embodiment, the display 74 includes a high impedance amplifier circuit 75, which avoids draining the respective memories, and a current meter display, such as a microammeter, milliammeter, ammeter, etc., 76, which may be of digital type. Reference to a meter herein also means equivalently recorders, computer type devices and the like. A potentiometer calibration adjustment 77 in the high impedance amplifier 75 and 78 in the current meter display 76 may be adjusted for calibrating the latter to display information in units representing the average current in the respective conductors 7-11. The high impedance amplifier 75 and current meter display 76 are conventional devices, such as those disclosed in the above U.S. Pat. No. 3,201,688, and the output information provided by the display 76 may be read and/or recorded by a technician to determine the condition of the respective cables 7-11 as a function of the current carried thereby.

In the relative read-out portion 71 of the read-out circuitry 16, the stored signals from the respective memories may be selectively compared with the largest one of said signals, with the sum of such signals, and/or with a reference signal. The relative value read-out portion, accordingly, includes a main selector switch 80 that couples a respective one of the stored signals from the bus 63 via a line 81 to a conventional comparator circuit 82, such as a differential amplifier circuit or other type of circuit that compares such stored signal to another signal provided at the input line 83 of the comparator. If desired, the comparator 82 may be a conventional electronic divider circuit that divides the signal from the line 81 by the signal on the line 83 to produce a fractional or percentage relationship that may be displayed in terms of percent conductivity by a conventional digital or analog meter type display 84. The signal provided the line 83 is selected by a function selector switch 85, which has a switch arm 86 that is selectively connectable with an OR gate 87 to receive the largest of the stored signals on the bus 63, a conventional summing or adding circuit 88, which produces at its output 89 a signal representing the sum of all the stored signals on the bus 63, or a reference signal generator 90, which produces on the line 91 a reference signal representative of a known condition or current carrying capability of a known or standardized cable. The OR gate is connected to all of the lines 64-68 in the bus 63 so that the signal produced on the output 92 of the OR gate is the largest of those stored signals and, thus, represents the condition or current carrying capability of the one of the cables 7-11 that is in best condition. Thus, when the switch arm 86 is connected to the line 92, the condition of the cable selected by the switch 80 is compared with the best one of several cables being monitored.

When the function selector switch 86 is connected to the line 89, the condition of the cable selected by the selector switch 80, then, is compared effectively with the average condition of all of the cables in the group 12 combined. Moreover, a separate meter 93 may be connected to the line 89 to provide a visual display of the total current being carried by the group 12 of cables 7-11. When the function selector switch 86 is connected to the line 91, a reference signal is established, for example, by adjustment of a potentiometer 94 that is coupled across a fixed voltage source, such as a battery 95. Such reference signal represents the condition of a known cable, such as the impedance or current carrying capability of a new or unused cable.

It will be appreciated that the output information provided in each of the foregoing cases, whether of the absolute or relative type information, can be obtained in a convenient manner, for example at the will of the technician in charge of, for example, the electric arc furnace, the cables of which are being monitored. Moreover, such output information may be evaluated in conventional manner and utilized, then, to advise the technician, for example, in determining when one or more of the cables of the group 12 requires replacement. Also, to facilitate testing or check-out of the system 1 and/or of obtaining additional information concerning the condition of one or more of the monitored cables, test points, such as the test points 96, 97, 98 provided in the monitor channels and other portions of the system, such as at the connection of the output of the comparator 82 and input to percent conductivity display 84, may be coupled to additional external equipment, such as computer equipment, display equipment, or the like.

As seen in FIG. 1, each of the test points 97 may be connected by respective lines 99, shown in phantom, to a further set of contacts 100 associated with the switch arm 73. By connection of the switch arm 73 to a respective one of the contacts 100, the output from respective timed integration networks 14 can be displayed on the read-out 76 to display continuously the current in a selected cable.

Moreover, in the read-out portion 71 the summing circuit 88 may have a connection represented by the lines 101 to each of the test points 97. By operating selectively a conventional switch 102 in the summing circuit, the latter can be electrically disconnected from the bus 63 and connected to the lines 101 to effect a continuous display on the meter 93 of the total current in all the cables 7-11.

Referring briefly to FIG. 3, a modified monitor channel 2' is illustrated. Such a modified monitor channel 2' may be substituted for each of the respective channels 2-6 in the system 1 described above with reference to FIG. 1. The modified monitor channel 2' includes an input circuit 13' with a transducer 30' and an analog to digital converter 103, and a timed integration network 14', which is substantially the same as that described above with reference to FIG. 1 and designated by unprimed numerals. In the embodiment illustrated in FIG. 3, the analog to digital converter 103, rather than the R.M.S. network 31 described above in connection with FIG. 1, converts the analog-like signal obtained by the transducer 30' to digital information accurately indicative of the current in the cable 7'. The analog to digital converter 103 may be a conventional one that produces digital information at its output 104 for integration over a period of time by the timed integration network 14' to obtain ultimately output information as described above with reference to the system 1 of FIG. 1. By adjusting the sensitivity of the analog to digital converter or the extent of its resolution, the accuracy of the digital information produced thereby can be altered in conventional manner to be indicative of the effective heating value of the AC electrical current in the cable 7.

Referring briefly to FIG. 4, a modified monitor channel 2" is illustrated. Such a modified monitor channel 2" may be substituted for each of the respective channels 2–6 in the system 1 described above with reference to FIG. 1. The modified monitor channel 2" includes an input circuit 13" with a transducer 30" and a voltage controlled oscillator 110, and a timed counter circuit 111. The oscillator 110 produces an AC signal having a variable frequency that is a function of instantaneous voltage of the transducer and, therefore, a function of the current in the conductor 7". The counter circuit 111 includes a conventional pulse counter 112 which counts each pulse of the variable frequency signal produced by the oscillator 110 when the timer 44" closes the switch 47" at the start of a timed cycle of operation initiated by the start switch 45", as above. A connection 113 between the start switch 45" and the counter 112 initializes the latter at the start of a timed cycle. A time divide circuit 56" and selector switch 58" may be used, as above, to normalize or to standardize the output of the counter 112. The counter output signal is deliverd to a memory, as above for selective read-out of cable condition information.

In FIGS. 5 and 6 the convenient operative use of the system 1 is manifest. In FIG. 5 the transducers 30 for the input circuits 2–6 are coupled about respective cables 7–11 which deliver one phase of electric power to a conventional electric arc furnace 120. The respective leads 32, represented by a single line for facility, deliver respective transducer signals to integrate and R.M.S. networks and the other portions of the system 1, which are positioned in a case 121 that is permanently mounted on the wall 122 of the furnace room 123. In FIG. 6, moreover, the case 124 for the system 1 is a portable one and may be positioned, for example, on a table 125 in the room 123. Thus, the transducers 30 of the portable system 1 may be disconnected from the respective cables 7–11 and the entire system moved to another location for use, for example, to monitor the condition of cables of another furnace.

STATEMENT OF INDUSTRIAL APPLICATION

In view of the foregoing, it will be clear that the cable condition analyzing system 1 in its preferred and alternate embodiments may be utilized to provide output information in an efficient, facile, and accurate manner, indicative of the condition of one or more current carrying cables. In particular, the system 1 may be employed to monitor the condition of the cables providing power to an electric furnace, such as an electric arc furnace or an induction furnace; it will be appreciated, though, that the system may be used to monitor the condition and/or current carrying capability of other cables or conductors.

The embodiments of the invention in which an exclusive property or privilege is claimed are defined as follows:

1. For use with electric arc furnaces or the like usually provided with multiple phase electrical power and having for each phase plural electrical cables that ordinarily conduct relatively large electrical currents and encounter current fluctuations during operation, a system for sensing current flow for use in analyzing the condition of all of such electrical cables serving a respective phase, comprising input means for simultaneously producing a plurality of representative electrical signals indicative, respectively, of the electrical currents carried by such plurality of cables, said input means comprising a separate input means for each of the cables being monitored by the system and each input means including a respective transducer that produces an output voltage representative of the change of current flowing through a monitored cable with respect to time and means for producing such representative electrical signals from such output voltages, timed means including a plurality of timed integrator means for respectively integrating simultaneously each of said representative electrical signals for a period of time to produce respective integrated signals, said timed integrator means comprising a separate one of the same for each of the cables analyzed by the system, each including an integrator circuit and timer means for delivering to said integrator circuit for a selected period of time said representative electrical signal for integration by said integrator circuit, means for coupling each integrator circuit to said input means, memory means for storing a plurality of stored signals, each being indicative of a respective integrated signal, means for coupling said memory means to said integrator circuits, and means for making a comparison between at least one of said stored signals representing the electrical signal carried by at least one such cable at a given time and at least another one of said stored signals representing the electrical signal carried by at least another such cable at the same time, said means for making a comparison including read-out means selectively operable for producing output information respresentative of said stored signals, and display means for displaying the output from said read-out means.

2. For use with electric arc furnaces or the like usually provided with multiple phase electrical power and having for each phase plural electrical cables that ordinarily conduct relatively large electrical currents and encounter current fluctuations during operation, a system for sensing current flow for use in analyzing the condition of all of such electrical cables serving a respective phase, comprising input means for simultaneously producing a plurality of representative electrical signals indicative, respectively, of the electrical currents carried by such plurality of cables, said input means comprising a separate input means for each of the cables being monitored by the system, each including a transducer that produces an output voltage representative of the change of current flowing through a monitored cable with respect to time and a voltage controlled oscillator means for producing a frequency signal having a frequency proportionally representative of the magnitude of such transducer output voltage, a separate timed means for each of the cables analyzed by the system, each of said timed means comprising counter means for counting for a period of time the number of frequency pulses produced by said respective voltage controlled oscillator means and timing means for establishing such period for said timed means, memory means for storing a plurality of stored signals representative of respective outputs of said timed means, and read-out means selectively operable for producing output information representative of said stored signals, and display means for displaying the output from said read-out means, whereby a comparison can be made between at least one of said stored signals representing the electrical signal carried by at least one such cable at a given time and at least another one of said stored signals representing the electrical signal carried by at least another such cable at the same time.

3. For use with electric arc furnaces or the like usually provided with multiple phase electrical power and having for each phase plural electrical cables that ordinarily conduct relatively large electrical currents and encounter current fluctuations during operation, a system for sensing current flow for use in analyzing the condition of all of such electrical cables serving a respective phase, comprising input means for simultaneously producing a plurality of representative electrical signals indicative, respectively, of the electrical currents carried by such plurality of cables, said input means comprising a separate input means for each of the cables being monitored by the system and including a transducer that produces an output voltage representative of the change of current flowing through a monitored cable with respect to time, and voltage controlled oscillator means for producing a frequency signal having a frequency proportionally representative of the magnitude of such transducer output voltage timed means including a plurality of timed integrator means for respectively integrating simultaneously each of said representative electrical signals for a period of time to produce respective integrated signals, and said timed integrator means comprising divider means for normalizing such integrated signals with respect to the period of time of operation of said timed means and counter means for counting for a period of time the number of frequency pulses produced by said voltage controlled oscillator means, memory means for storing a plurality of stored signals, each being indicative of a respective integrated signal, and read-out means selectively operable for producing output information representative of said stored signals, and display means for displaying the output from said read-out means, whereby a comparison can be made between at least one of said stored signals representing the electrical signal carried by at least one such cable at a given time and at least another one of said stored signals representing the electrical signal carried by at least another such cable at the same time.

4. The system of claims 1, 2, or 3, said transducer comprising a toroid current transformer.

5. The system of claims 1, 2, or 3, said input means comprising an integrator and an R.M.S. network.

6. The system of claim 1, said input means comprising an analog to digital converter.

7. The system of claim 1, 2, or 3 said memory means comprising a separate electrical memory for each of said integrated signals.

8. The system of claim 1, further comprising a single timing means for controlling said timer means for simultaneously effecting delivery of all of said representative electrical signals to respective integrator circuit means.

9. The system of claim 8, said input means comprising a separate integration and R.M.S. network for each of the cables analyzed by the system.

10. The system of claim 8, said input means comprising a separate analog to digital converter means for converting each of said respective monitored signals to respective digital signals.

11. The system of claims 1, 2, 3 or 10, said read-out means comprising a current measuring meter and selector means for selecting a respective one of said stored signals for delivery to said meter.

12. The system of claim 11, said current measuring meter comprising a high impedance amplifier.

13. The system of claims 1, 2, 3, or 8, said read-out means comprising comparison means for comparing the largest of said stored signals selectively with each of said stored signals.

14. The system of claims 1, 2, 3, or 10, said read-out means comprising comparison means for comparing each of said stored signals with the sum of said stored signals.

15. The system of claims 1, 2, 3 or 8, further comprising means for generating a reference signal representative of a known condition of an electrical cable, and said read-out means comprising comparison means for comparing each of said stored signals with said reference signal.

16. The system of claim 13, said display means comprising means for displaying the output from said comparison means as a representation of percent conductivity of the cable represented by a respective stored signal.

17. The system of claim 14, said display means comprising means for displaying the output from said comparison means as a representation of percent conductivity of the cable represented by a respective stored signal.

18. The system of claim 15, said display means comprising means for displaying the output from said comparison means as a representation of percent conductivity of the cable represented by a respective stored signal.

19. The system of claims 1, 2, or 3, said read-out means comprising a single read-out means for producing selectively said output information representative of each of said stored signals.

20. The system of claim 1, said timed means further comprising divider means for normalizing said combined signal with respect to the period of time of operation of said timed means.

21. The system of claim 20, said input means comprising an integrator and an R.M.S. network.

22. The system of claim 20, said input means comprising an analog to digital converter.

23. The system of claims 1, 2, or 3 wherein said system is portable.

24. The system of claims 1, 2, or 3 wherein said system is permanently located proximate an electric furnace.

25. The system of claims 1, 2, or 3 further comprising means for connecting at least one of said input means, timed means and memory means to external electrical equipment.

26. The system of claim 1, further comprising means for selectively continuously producing output information from respective integrator circuits representative of the current flowing in respective selected cables.

27. The system of claim 1, further comprising means for continuously monitoring all of said integrating circuits to produce continuous output information indicative of the total current in all of said cables.

28. The system of claim 1, further comprising means for continuously monitoring the sum of all the stored signals in said memory means to produce continuous output information indicative of the total current in all of said cables.

* * * * *